(12) United States Patent
Kim et al.

(10) Patent No.: US 11,715,653 B2
(45) Date of Patent: Aug. 1, 2023

(54) SUBSTRATE PROCESSING APPARATUS

(71) Applicant: Samsung Electronics Co., Ltd., Suwon-si (KR)

(72) Inventors: Byeonghoon Kim, Suwon-si (KR); Byunghwan Kong, Suwon-si (KR); Seungyong Bae, Suwon-si (KR); Jaehyun An, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 594 days.

(21) Appl. No.: 16/694,213

(22) Filed: Nov. 25, 2019

(65) Prior Publication Data
US 2020/0373175 A1    Nov. 26, 2020

(30) Foreign Application Priority Data

May 24, 2019    (KR) .......................... 10-2019-0061238

(51) Int. Cl.
*H01L 21/67*    (2006.01)

(52) U.S. Cl.
CPC .... *H01L 21/67109* (2013.01); *H01L 21/6719* (2013.01); *H01L 21/67115* (2013.01)

(58) Field of Classification Search
CPC ......... H01L 21/67109; H01L 21/67103; H01L 21/67115; H01L 21/67098; C23C 16/46
See application file for complete search history.

(56) References Cited

U.S. PATENT DOCUMENTS

| | | | |
|---|---|---|---|
| 5,264,038 A | 11/1993 | Hara et al. | |
| 5,407,485 A * | 4/1995 | Takagi | C23C 16/46 118/724 |
| 5,571,010 A * | 11/1996 | Okase | C23C 16/4583 432/239 |
| 6,310,755 B1 * | 10/2001 | Kholodenko | C04B 35/565 361/115 |
| 6,344,631 B1 | 2/2002 | Chacin | |
| 6,403,923 B1 | 6/2002 | Tay et al. | |
| 6,454,563 B1 | 9/2002 | Lim et al. | |
| 6,537,422 B2 | 3/2003 | Sakuma et al. | |
| 9,640,412 B2 | 5/2017 | Aderhold et al. | |
| 10,161,041 B2 | 12/2018 | Lo et al. | |
| 2003/0131493 A1 | 7/2003 | Lee | |
| 2006/0144336 A1 * | 7/2006 | Um | C23C 16/46 156/345.52 |
| 2010/0323313 A1 | 12/2010 | Toriya et al. | |
| 2012/0070577 A1 | 3/2012 | Deura et al. | |

(Continued)

FOREIGN PATENT DOCUMENTS

| | | |
|---|---|---|
| JP | 2922743 B2 | 7/1999 |
| JP | 2951239 B2 | 9/1999 |

(Continued)

*Primary Examiner* — Aiden Lee
(74) *Attorney, Agent, or Firm* — Harness, Dickey & Pierce, P.L.C.

(57) ABSTRACT

A substrate processing apparatus includes a process chamber, a support part, disposed in the process chamber, having a substrate loading region in which a substrate is seated, a heating part disposed in a location opposing the substrate loading region to heat the substrate loading region, and a reflective member, disposed in a location opposing the substrate loading region in the process chamber, in which a sealed hollow portion is disposed.

19 Claims, 18 Drawing Sheets

(56) References Cited

U.S. PATENT DOCUMENTS

| | | | |
|---|---|---|---|
| 2012/0171870 A1* | 7/2012 | Mitrovic | ........... C23C 16/45508 |
| | | | 438/758 |
| 2013/0047916 A1 | 2/2013 | Nishibayashi et al. | |
| 2018/0010243 A1 | 1/2018 | Lee et al. | |

FOREIGN PATENT DOCUMENTS

| JP | 2007149774 A | 6/2007 |
|---|---|---|
| JP | 6376236 B2 | 8/2018 |
| KR | 1020040001863 A | 1/2004 |
| KR | 101535547 B1 | 7/2015 |
| KR | 1020170083188 A | 7/2017 |
| KR | 1020180005465 A | 1/2018 |

* cited by examiner

I-I'

III-III'

SUBSTRATE PROCESSING APPARATUS

CROSS-REFERENCE TO RELATED APPLICATION(S)

This application claims benefit of priority to Korean Patent Application No. 10-2019-0061238 filed on May 24, 2019 with the Korean Intellectual Property Office, the disclosure of which is incorporated herein by reference in its entirety.

BACKGROUND

The present disclosure relate to a substrate processing apparatus.

In a manufacturing process of a semiconductor device, various material layers are formed on a semiconductor substrate. In an effort to make these material layers have a uniform thickness in all regions without regard to a shape morphology of an underlying layer, it may be desirable to supply a source gas uniformly and to maintain a uniform temperature of a wafer, on which a material layer is formed, during a process required to form the material layer.

However, as a wafer becomes larger in diameter, a temperature may vary depending on regions of even a single wafer. Therefore, it may be difficult to ensure temperature uniformity of a wafer. In addition, as a process is applied to process a plurality of wafers simultaneously, it may be more difficult to uniformly heat the plurality of wafers.

SUMMARY

Example embodiments provide a substrate processing apparatus which may reduce (or, alternatively, alleviate) a temperature distribution difference of a substrate to secure temperature uniformity while enhancing a thermal insulation effect during substrate processing to inhibit (or, alternatively, prevent) loss of energy required to heat a substrate.

According to an example embodiment, a substrate processing apparatus includes a process chamber; a support part in the process chamber, the support part including a substrate loading region configured to support a substrate seated therein; a heating part configured to heat the substrate loading region; and a reflective member proximal to the substrate loading region in the process chamber, the reflective member having a sealed hollow portion therein.

According to an example embodiment, a substrate processing apparatus includes a process chamber; a support part in the process chamber, the support part including a substrate loading region configured to support a substrate seated therein; a heating part configured to heat the substrate loading region; and a reflective member proximal to the substrate loading region in the process chamber, the reflective member having a sealed hollow portion therein, the reflective member configured to reflect heat emitted from the substrate loading region to the substrate loading region, a the reflective member including at least one of quartz, ceramic, and a metal, wherein the reflective member is disc shaped and has a diameter of 280 mm to 320 mm and a thickness of 10 mm to 20 mm, and the sealed hollow portion therein has a thickness of 3 mm to 5 mm.

According to an example embodiment, a substrate processing apparatus includes a process chamber; and a support part in the process chamber, the support part including a substrate loading region configured to support a substrate seated therein, the support part including, a heating part below the substrate loading region, and a hollow portion below the heating part, the hollow portion defined by at least three internal surfaces including a first internal surface facing the substrate loading region, a second internal surface opposing the first internal surface, and an internal side surface connecting the first internal surface and the second internal surface.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
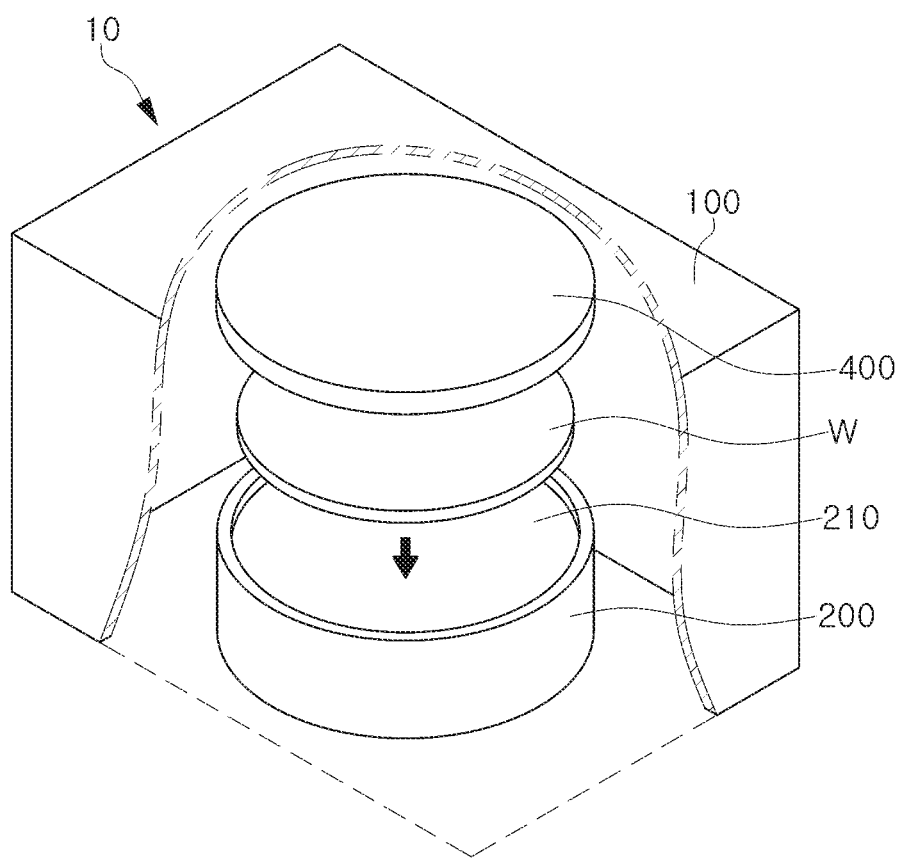
FIG. 1 is a schematic perspective view of a substrate processing apparatus according to an example embodiment.
Figure 2:
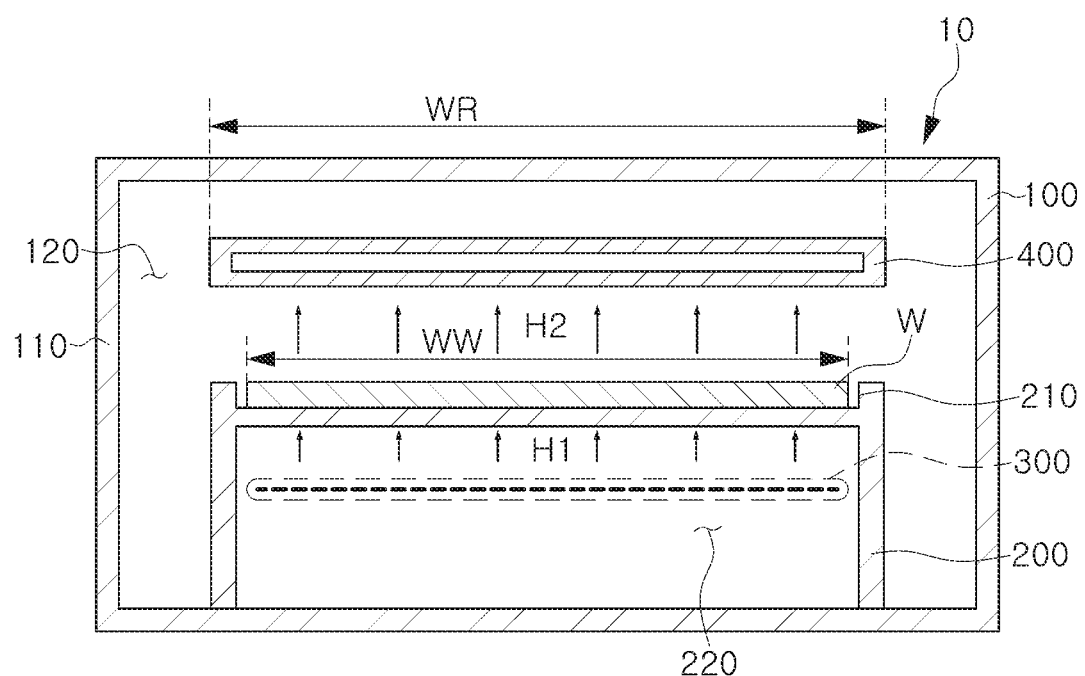
FIG. 2 is a schematic cross-sectional view illustrating that a substrate of FIG. 1 is seated in a substrate loading region.
Figure 3A:
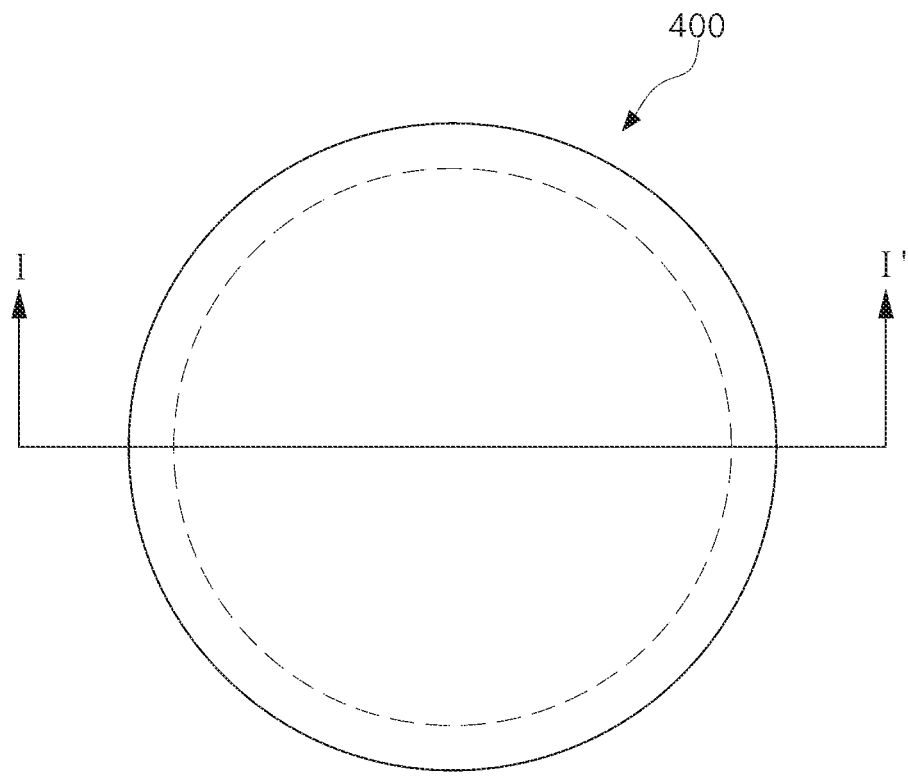
FIG. 3A is a top view of a reflective member of FIG. 1.
Figure 3B:
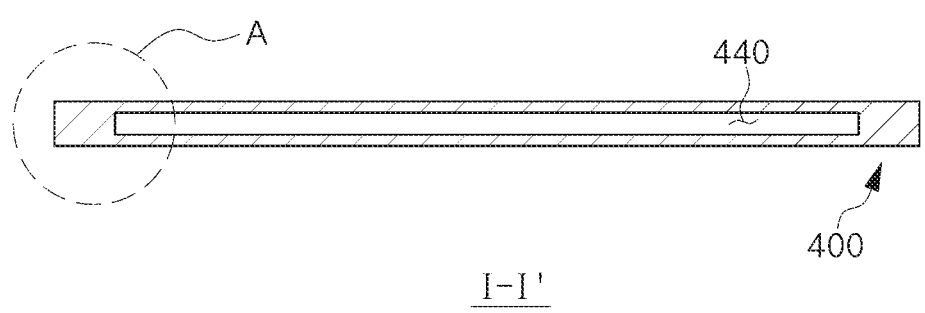
FIG. 3B is a side cross-sectional view when viewed in a direction I-I' of FIG. 3A.
Figure 3C:
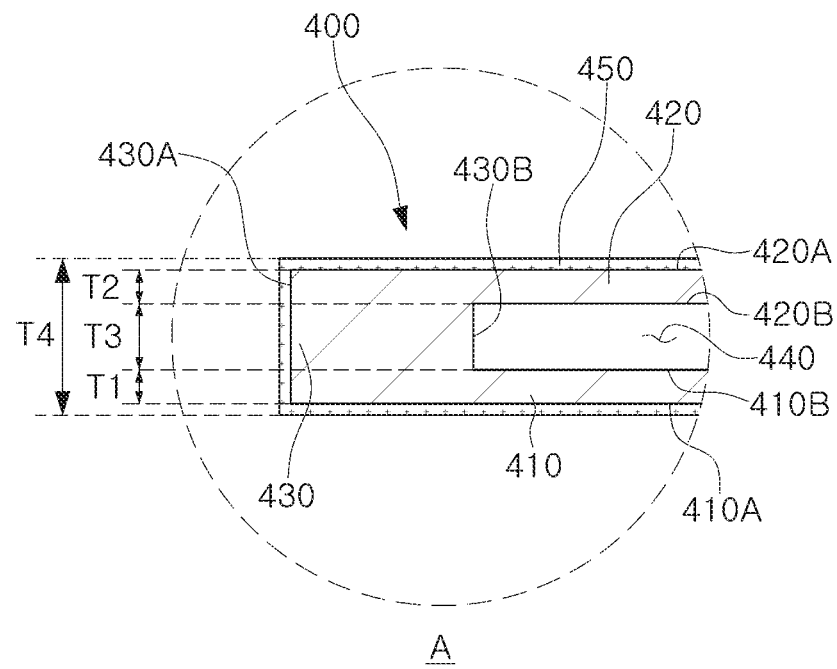
FIG. 3C is an enlarged view of portion A of FIG. 3B.

A substrate processing apparatus according to an example embodiment will be described with reference to FIGS. 1 to 3C. FIG. 1 is a schematic perspective view of a substrate processing apparatus according to an example embodiment, and FIG. 2 is a schematic cross-sectional view illustrating that a substrate of FIG. 1 is seated in a substrate loading region. FIG. 3A is a top view of a reflective member of FIG. 1, FIG. 3B is a side cross-sectional view when viewed in a direction I-I' of FIG. 3A, and FIG. 3C is an enlarged view of portion A of FIG. 3B.

Referring to FIGS. 1 and 2, a substrate processing apparatus 10 according to an example embodiment may include a process chamber 100, a support part 200 having a substrate loading region 210 in which a wafer W is seated, a heating part 300 configured to heat the substrate loading region 210, and a reflective member 400 configured to reflect heat, emitted from the substrate loading region 210, to compensate for heat of the wafer W.

An example embodiment has been described as an example in which a semiconductor thin film is formed on the wafer W, a semiconductor substrate. However, the present inventive concepts are not limited thereto and may be applied to various process of heating and processing a semiconductor substrate.

The process chamber 100 may have an internal space 120, having a desired (or, alternatively, a predetermined) size, defined by an external wall 110 as a reactive space in which the wafer W is processed, and may be formed of a material having improved abrasion resistance and improved corrosion resistance. The process chamber 100 allows the internal space 120 to be maintained in a sealed state or a vacuum state during a deposition process.

In the process chamber 100, the support part 200 may be provided with the substrate loading region 210 in which the wafer W is seated. The substrate loading region 210 may be provided to have an area sufficient for the wafer W to be disposed a top surface of the support part 200. The heating part 300 is disposed in a lower space 220 of the support part 200 to heat the wafer W seated on the substrate loading region 210. The heating part 300 may irradiate heat H1 to the substrate loading region 210 to heat the wafer W. A portion H2 of the heat, absorbed to the heated wafer W, may be radiated in a direction of the reflective member 400.

In a process of forming a certain material layer on the wafer W loaded in the substrate loading region 210, the heating part 300 may heat the wafer W to a temperature appropriate for formation of the material film. After a temperature of the wafer W is stabilized to be appropriate for formation of the material film, the wafer W may be maintained at a constant temperature until the material film is formed on the wafer W. The heating part 300 may also be used in a wafer annealing process, performed to stabilize the material layer, after the material layer is formed on the wafer W. For example, the heating part 300 may be used to increase the temperature of the wafer W to a temperature appropriate for the annealing process and maintain the increased temperature until the annealing process is completed.

The reflective member 400 may be disposed to face the substrate loading region 210 in the process chamber 100 and may reflect heat, emitted from the wafer W disposed in the substrate loading region 210, to the wafer W. A diameter WR of the reflective member 400 may be equal to a diameter WW of the wafer W, but may be greater than the diameter WW of the wafer W in consideration of heat reflection efficiency. The diameter WR of the reflective member W may less than or equal to 200% of the diameter WW of the wafer W. In an example embodiment, the diameter WR of the reflective member 400 may be 200 mm to 400 mm, in detail, 280 mm to 320 mm. When the diameter WR of the reflective member 400 is smaller than the diameter WW of the wafer W, the heat reflection efficiency may be reduced. In addition, when the diameter WR of the reflective member 400 is greater than 200% of the diameter WR of the wafer W, the reflective member 400 may occupy an unnecessarily large area of the internal space 120, and thus, a size of the process chamber 100 may be increased more than necessary.

In the example embodiment, the reflective member 400 is illustrated as having a disc shape, but a shape of the reflective member 400 is not limited thereto.

Hereinafter, the reflective member 400 will be described in detail with reference to FIGS. 3A and 3C. Referring to FIG. 3A, the reflective member 400 has a circular shape similar to a shape of the wafer W when viewed from above, but a shape of the reflective member 400 is not limited thereto. The reflective member 400 may have a shape such as square, or the like, as long as an area of the reflective member 400 is large enough to fully cover the wafer W.

Referring to FIGS. 3B and 3C, the reflective member 400 includes a first plate 410 disposed at a lower portion thereof, a sidewall portion 430 disposed on the first plate 410, and a second plate 420 disposed on the sidewall portion 430. The first plate 410, the sidewall portion 430, and the second plate 420 may be bonded to each other to form a hollow portion 440 in the reflective member 400. Although the first plate 410, the sidewall portion 430 and the second plate 420 may be bonded to each other after they are separately formed, the first plate 410 and the sidewall portion 430 may be integrally formed, similarly to preparing of a base having a concave groove. In addition, the second plate 420 and the sidewall portion 430 may be variously modified, for example, integrally formed with each other. Each of the first and second plates 410 and 420 has a surface exposed outwardly, which has a planar shape. However, the exposed surface of each of the first and second plates 410 and 420 may have a convex or concave shape, and unevenness may be formed on the exposed surface.

The first plate 410 forms a first external surface 410A of the reflective member 400, disposed to face the substrate loading region 210, and the second plate 420 forms a second external surface 420A of the reflective member 400 disposed to oppose the first external surface 410. The first plate 410, the sidewall portion 430, and the second plate 420 may form an external side surface 430A connecting the first external surface 410A and the second external surface 420A. According to example embodiments, the first external surface 410A, the second external surface 420A, and the external side surface 430A may be coated with a reflective layer 450, formed of a material having reflectance higher than reflectance of a material of each of the first plate 410, the sidewall portion 430, and the second plate 420, to improve reflectance on a surface of the reflective member 400.

The hollow portion 440 is a sealed internal space formed by the first plate 410, the second plate 420, and the sidewall portion 430. The hollow portion 440 may be defined by a first internal surface 410B disposed to oppose the first external surface 410A of the first plate 410, a second internal surface 420B disposed to oppose the second external surface 420A of the second plate 420, and an internal side surface 430B connecting the first and second internal surfaces 410B and 420B to each other. Each of the first internal surface 410B, the second internal surface 420B, and the internal side surface 430B may be processed to have high reflectance. The hollow portion 440 may be vacuum or may be sealed after being filled with air or a desired (or, alternatively, a predetermined) gas. As described above, the hollow portion 440 having a sealed portion may improve thermal reflection efficiency of the reflective member 400, which will be described in detail later.

The first plate 410, the sidewall portion 430, and the second plate 420 may be formed of a highly reflective material to have high thermal reflectance. A higher reflective material may be coated on a surface to further increase reflectance on the surface. In an example embodiment, the first plate 410, the sidewall portion 430 and the second plate 420 may be formed of at least one of quartz, ceramic, and metal. According to example embodiments, the first plate 410, the sidewall portion 430 and the second plate 420 may be formed of various types of quartz having transparency, white, black, and the like, such as CFQ®, OM100®, OP3®, HRC® (Heraus Reflective Coating), and HBQ® (Heraus Black Quartz). In addition, the first plate 410, the sidewall portion 430 and the second plate 420 may be formed of ceramics such as alumina ($Al_2O_3$), zirconia ($ZrO_2$), and thoria ($ThO_2$). The first plate 410, the sidewall portion 430 and the second plate 420 may be formed of a highly reflective metal such as silver (Ag), gold (Au), tantalum (Ta), niobium (Nb), molybdenum (Mo), tungsten (W), nickel (Ni), platinum (Pt), aluminum nitride (AlN), or the like. The first plate 410, the sidewall portion 430, and the second plate 420 may be formed of the same material. However, at least one of the first plate 410, the sidewall portion 430, and the second plate 420 may be formed of a different material.

Referring to FIG. 3C, the reflective member 400 may be provided in the form of a plate having a desired (or, alternatively, a predetermined) thickness. The reflective member 400 may have a thickness T4 of 5 mm to 30 mm, in detail, 10 mm to 20 mm. When the thickness T4 of the reflective member 400 is less than 5 mm, thicknesses T1 and T2 of the first plate 410 and the second plate 420 of the reflective member 400 may be too thin, thermal reflectance efficiency of the reflective member 400 may be significantly decreased. When the thickness T4 of the reflective member 400 is greater than 30 mm and the reflective member 400 is disposed on a top surface of the wafer W, a distance between the reflective member 400 and the wafer W may be significantly decreased in a limited space of the process chamber 100 to limit a path of a robot arm for loading or unloading the wafer W to or from the process chamber 100.

Similarly to the example embodiment, when the reflective layer 450 is formed on a surface of the reflective member 400, the thickness T4 of the reflective member 400 may be a thickness including a thickness of the reflective layer 450. The thickness T1 of the first plate 410 and the thickness T2 of the second plate 420 may be equal to each other, but the thicknesses of the first plate 410 and the thickness T2 are not limited thereto. In some example embodiments, one of the thicknesses of the first plate 410 and the thickness T2 may be greater than the other thickness. The hollow portion 440 may be provided to have a thickness T3 of 1 mm to 10 mm, in detail, a thickness T3 of 3 mm to 5 mm, but a thickness of the hollow portion 440 is not limited thereto and may be adjusted depending on the thicknesses of the first plate 410 and the second plate 420. When the thickness T3 of the hollow portion 440 is less than 1 mm, the first plate 410 and the second plate 420 may be brought into close contact with each other to reduce a thermal efficiency improvement effect of the hollow portion 440. When the thickness T3 of the hollow portion T3 is greater than 10 mm, the thermal efficiency improvement effect may not be great, and the narrow internal space of the process chamber 100 may be limited to limit the path of the robot arm for loading or unloading the wafer W to or from the process chamber 100.

Figure 4A:
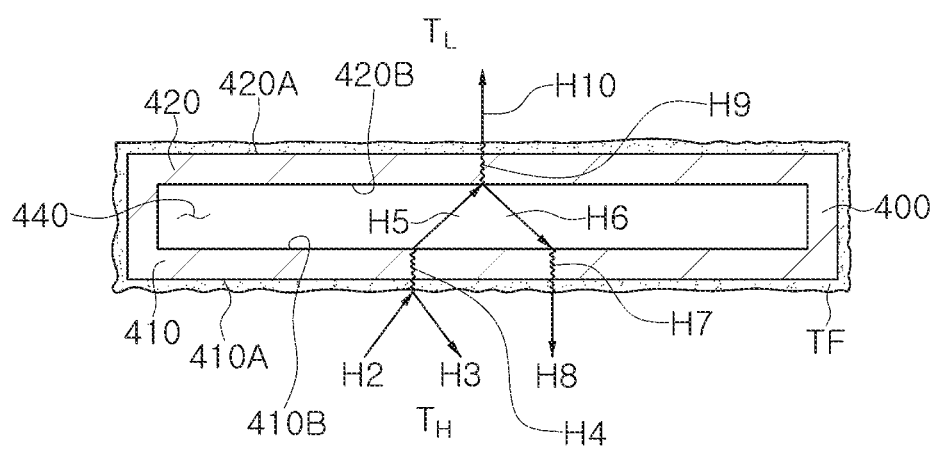
FIGS. 4A and 4B illustrate a comparison between thermal reflectance of a reflective member according to an example embodiment and thermal reflectance of a reflective member according to a comparative example.
Figure 4B:
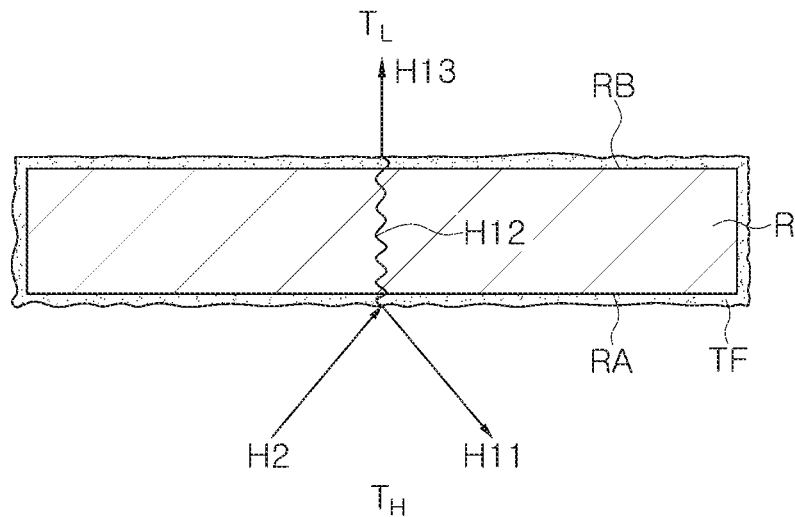

Hereinafter, a thermal reflectance improvement effect of a reflective member according to an example embodiment will be described with reference to FIGS. 4A and 4B. FIGS. 4A and 4B illustrate a comparison between thermal reflectance of a reflective member according to an example embodiment and thermal reflectance of a reflective member according to a comparative example.

The reflective member 400 reflects heat, radiated from the wafer W, to compensate for heat lost in the wafer W. Therefore, when the reflective member 400 is disposed inside the process chamber 100, a distance from the heating part 300, serving as a heat source, and the wafer W may be decreased to improve thermal reflectance. However, a material layer such as a thin film TF may be formed on a surface of the reflective member 400 during deposition when the reflective member 400 is disposed inside the process chamber 100, such that thermal reflectance efficiency is reduced on the surface of the reflective member 400. The thermal reflectance efficiency may be further reduced when a deposition process is performed in the process chamber 100. The reflective member 400 is formed of a highly reflective material to have high thermal reflectance on the surface thereof. The thin film TF, formed on the surface of the reflective member 400, has lower thermal reflectance than the reflective member 400. Accordingly, actual heat reflectance of the reflective member 400 may be rather decreased due to the thin film TF, formed on the surface of the reflective member 400, even when the reflective member 400 is disposed inside the process chamber 100.

In FIGS. 4A and 4B, a reference $T_H$ denotes a high-temperature region as a direction, in which the heating part 300 of FIG. 2 is present, and a reference $T_L$ denotes a low-temperature region. Accordingly, heat has a flow from $T_H$ to $T_L$.

Referring to FIGS. 2 and 4A, in an example embodiment, a portion H3 of the heat H2, emitted from the heating part 300 to the first external surface 410A of the reflective member 400, is reflected to the thin film TF formed on the surface of the reflective member 400 and the rest heat H4 is absorbed to the thin film. Thus, the heat H2 is conducted into the reflective member 400. When the thin film TF is formed on the surface of the reflective member 400, thermal reflectance on the surface of the reflective member 400 may be reduced, as compared with thermal reflectance when the thin film TF is not formed. In addition, heat absorption may be raised to increase the heat H4 conducted into the reflective member 400.

In an example embodiment, the hollow portion 440 may be formed in the reflective member 400 to compensate for the reduced thermal reflectance. For example, since the hollow portion 440 in the reflective member 400 is sealed and the thin film layer TF is not formed on the surface of the hollow portion 440, high reflectances of the first internal surface 410B, the second internal surface 420B, the internal side surface 430B may be maintained, respectively. Accordingly, after being conducted into the reflective member 400, a portion H9 may be absorbed and a portion H6 of radiated heat H5, emitted from the first internal surface 410B in a direction of the second internal surface 420B, is reflected from the second internal surface 420B in the direction of the first internal surface 410B and then is conducted toward the first external surface 410A. The conducted heat H7 is radiated in through the first external surface 410A in a direction in which the substrate loading region 210 is disposed. Accordingly, this embodiment has an effect that heat is further reflected to the substrate loading region 210 by H8, as compared to a case in which there is no hollow portion 440. As a result of the experiment, it was found that H8 corresponded to about 20% when radiated heat H10 was about 50% of H2. Accordingly, it was confirmed that the thermal reflectance of the reflective member 400 increased from 50% to 70%.

Meanwhile, in Comparative Example of FIG. 4B in which a hollow portion is not formed in a reflective member R, a portion H11 of the heat H2, emitted from a heating part toward a first external surface RA of the reflective member R, is reflected on a thin film TF formed on a surface of the first external surface RA and the other heat H12 is absorbed to be conducted into the reflective member R. The conducted heat H12 is emitted through a second external surface RB of the reflective member R as radiated heat H13. Accordingly, in this example embodiment, it was confirmed that since heat corresponding to H8 was emitted in a direction of the second external surface RB, heat was reflected by H8 less, as compared to example embodiments.

Hereinafter, various example embodiments of a reflective member will be described with reference to FIGS. 5 to 11.

Figure 5:
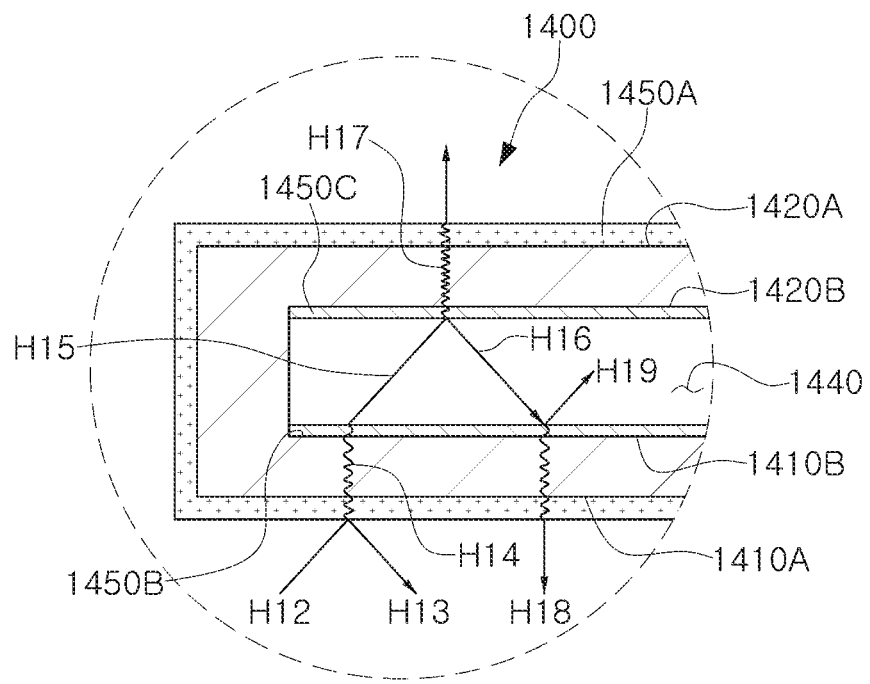
FIGS. 5 to 11 illustrate various examples of a reflective member according to an example embodiment.

Referring to FIG. 5, an example embodiment is a case in which a hollow portion having a first internal surface 1410B on which a second reflective layer 1450B is formed, and a second internal surface 1420B on which a third reflective layer 1450C is formed, as compared with the example embodiment described above with reference to FIG. 3C. The third reflective layer 1450C may be formed of a material similar to a material of the first reflective layer 1450A. In this example embodiment, the first and third reflective layers 1450A and 1450C may be formed by coating at least one of quartz, ceramic, and a metal. According to some example embodiments, the first and third reflective layers 1450A and 1450C may be formed by coating quartz such as HBQ® (Heraus Black Quartz).

In an example embodiment, the portion H13 of the heat H12, irradiated to the first external surface 1410A, is reflected from the first reflective layer 1450A and a portion H14 of the heat H12 is conducted into the reflective member 1400, which is the same as described in the above embodiment. However, since a portion H16 of the heat H15 is reflected in the direction of the first internal surface 1410B by the third reflective layer 1450C, a highly reflective material layer coated on the second internal surface 1420B, conducted heat H17 may be reduced and heat H18, reflected to the substrate loading region, may be further increased.

In addition, the second reflective layer 1450B, a low reflective material layer, having high thermal absorbance may be coated on the first internal surface 1410B to decrease the amount of heat H19 re-reflected from the first internal surface 1410B in a direction of the second internal surface 1420B. Accordingly, the heat H18, reflected to the substrate loading region, may be further increased.

Figure 6:
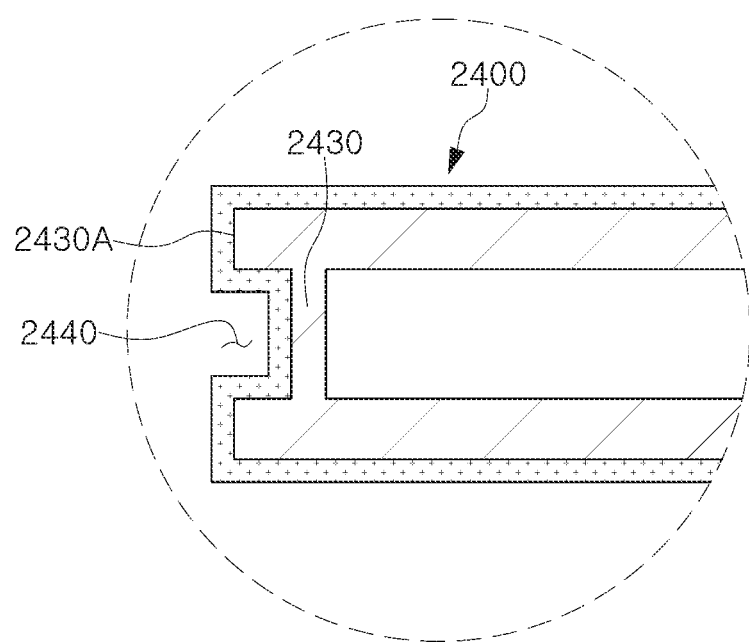

Referring to FIG. 6, an example embodiment is a case in which a groove portion 2440 is formed in an external side surface 2430A of a sidewall portion 2430 of a reflective member 2400. When a projection corresponding to the groove portion 2440 is formed on a holder for holding the reflective member 2400, the groove portion 2440 may be slidably coupled to the projection. Thus, the reflective member 2400 may be easily removable.

Figure 7A:
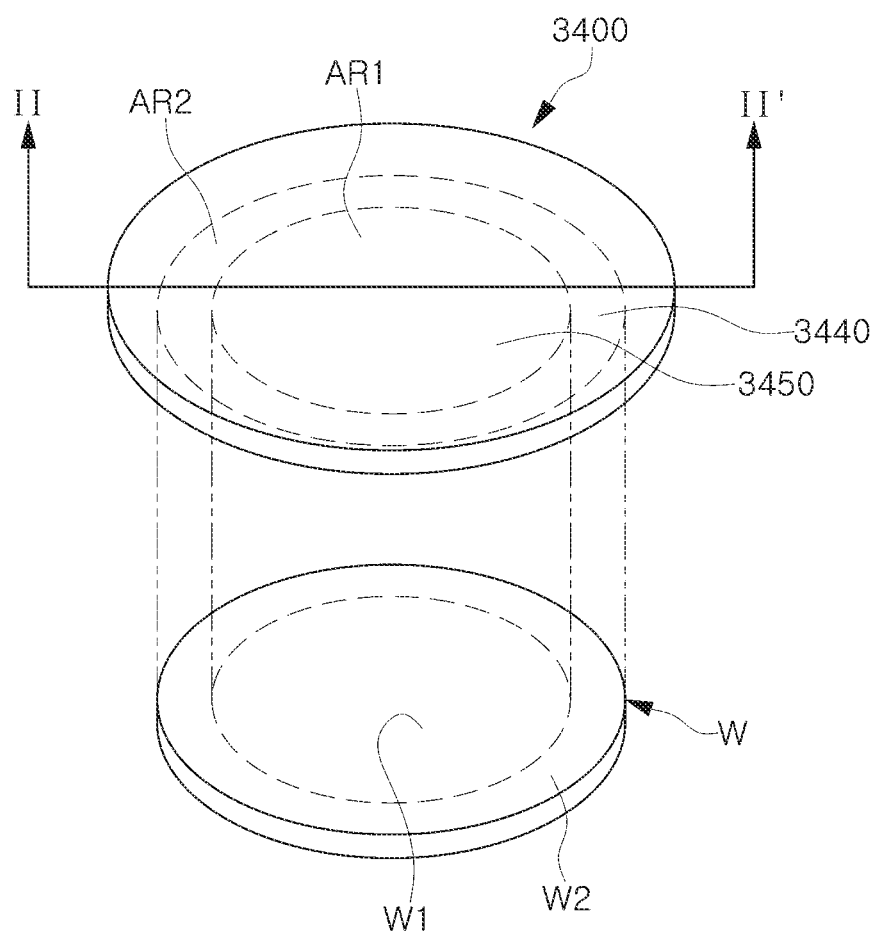
Figure 7B:
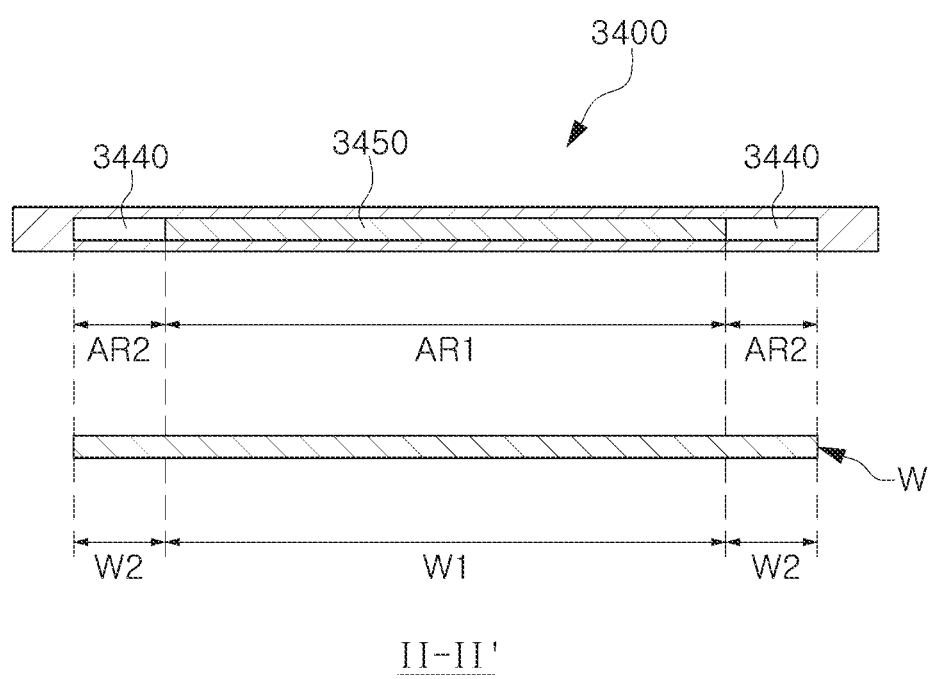

Referring to FIGS. 7A and 7B, an example embodiment is a case in which a disposition of a hollow portion is changed such that a distribution of heat, reflected from a reflective member 3400, is adjusted to be changed.

An example embodiment is a case in which a thermal absorption member 3450 is disposed in a first region AR1 of the reflective member 3400 corresponding to a central region W1 of a wafer W, such that a hollow portion 3440 is restrictively disposed only in a second region AR2 corresponding to a circumferential region W2 of the wafer W. Since the hollow portion 3440 is disposed in the second region AR2, thermal reflectance of the second region AR2 may be further increased than that of the first region AR1 to reflect more heat to the circumferential region W2 of the wafer W. Accordingly, the temperature distribution of the wafer W may be adjusted as desired by adjusting a region in which the hollow portion 3440 is disposed in the reflective member 3400. For example, when a temperature of a central region W1 of the wafer W is higher than a temperature of the circumferential region W2 of the wafer W, the hollow portion 3440 is disposed only in the second region AR2 of the reflective member 3400 to achieve uniform temperature distribution of the wafer W. In addition, when a heating part is disposed on a side surface of a process chamber and a reflective member is applied to a batch-type substrate processing apparatus in which a temperature of the circumferential region of a wafer is higher than a temperature of a central region of the wafer, a hollow portion may be disposed only in a central region of the reflective member to achieve uniform temperature distribution of the wafer.

Figure 7C:
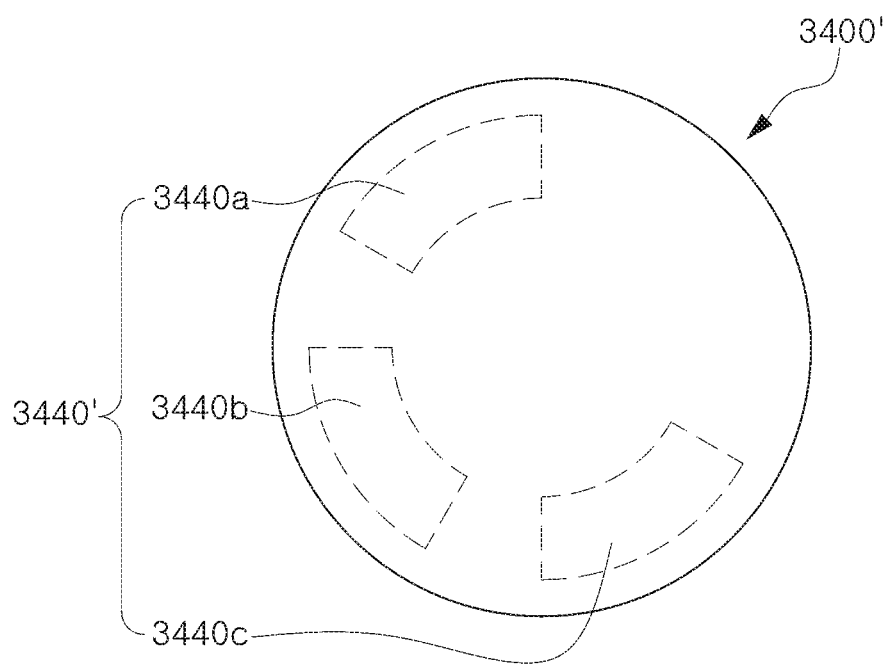

FIG. 7C illustrate an example in which the hollow portion 3440 of FIG. 7B is divided into a plurality of separated regions. A hollow portion 3440' is disposed in a region of a reflective member 3400' corresponding to a circumferential region of a wafer, which is the same as described in the above embodiment of FIG. 7B. However, the hollow portion 3440' is divided into separated regions 3440a, 3440b, and 3440c. In this embodiment, a plurality of separate regions 3440a, 3440b, and 3440c are disposed in a portion of the circumferential region of the wafer in which a temperature is desired to relatively increase.

Figure 8:
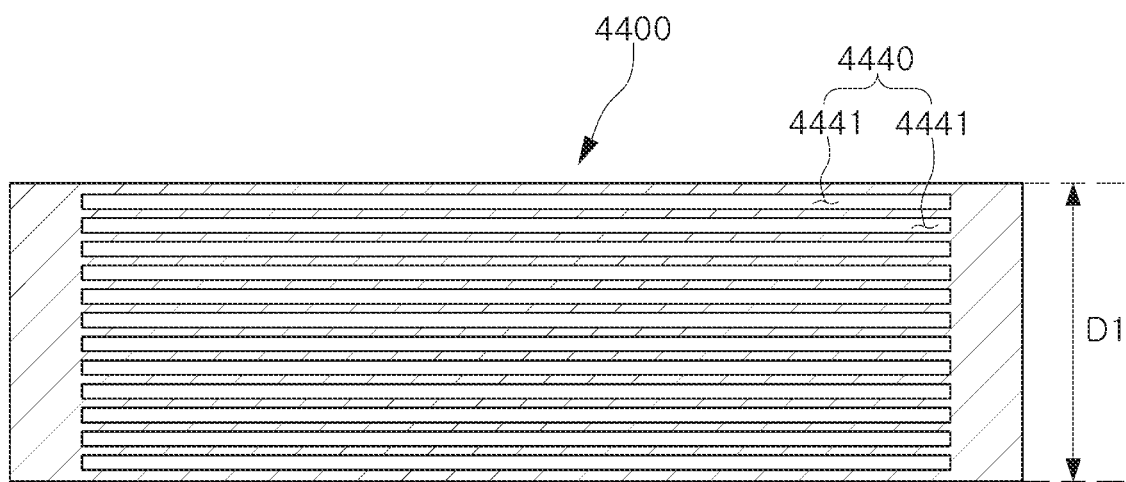

Referring to FIG. 8, an example embodiment is a case in which a hollow portion 4440 has a plurality of separated regions 4441 in a reflective member 4400 and the separated regions 4441 are stacked in a thickness direction of the reflective member 4440. In this case, a plurality of reflective members, each having one hollow portion, may be replaced with one reflective member. Sizes of the plurality of separate regions 4441 may be equal to each other, but sizes of some of the separated regions 4441 may be different from each other in certain embodiments. At least one of a metal, ceramic, and quartz, highly reflective materials, may be selectively coated only in some of the separated regions 4441.

Figure 9A:
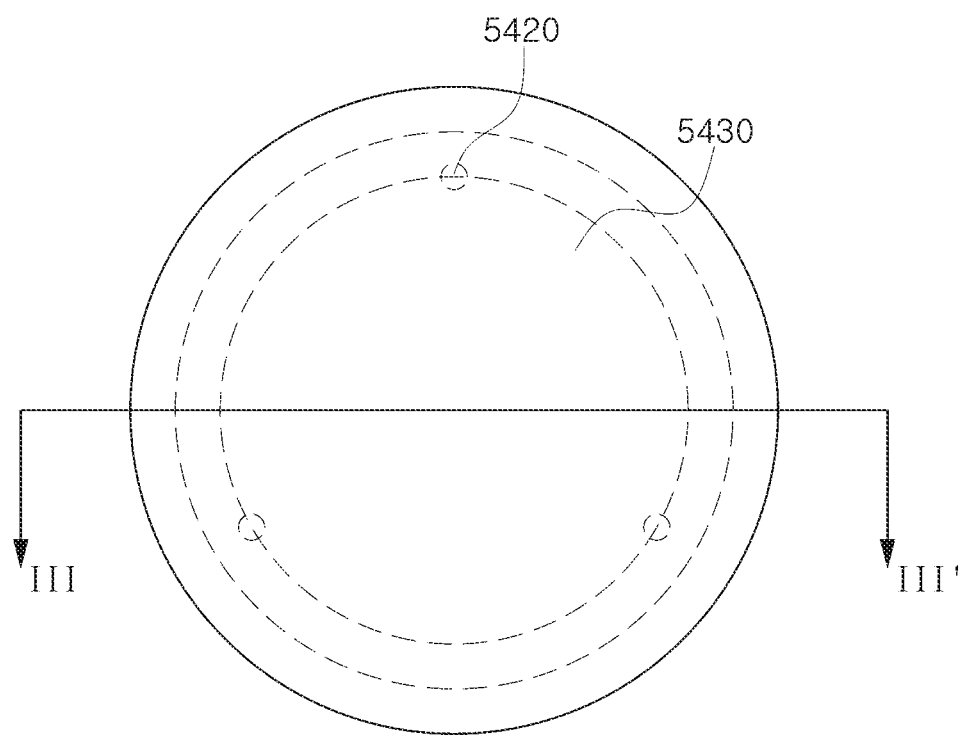
Figure 9B:
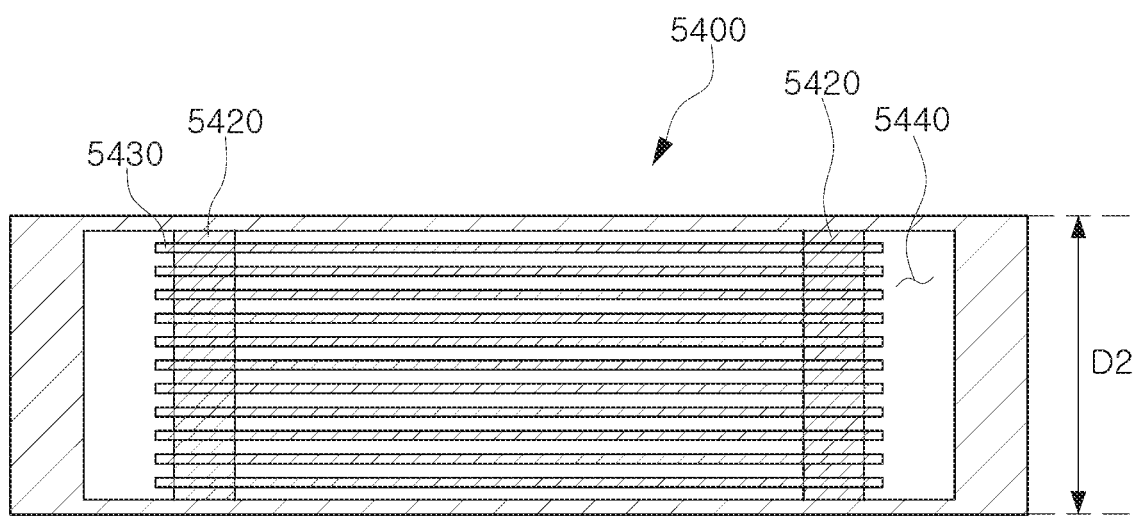

Referring to FIGS. 9A and 9B, an example embodiment is a case in which a plurality of sub-reflective members 5430 are further disposed in one hollow portion 5440 of a reflective member 5400.

In this embodiment, the plurality of sub-reflective members 5430 are spaced at regular intervals and coupled to a holder 5420 formed in the hollow portion 5440. The plurality of sub-reflective members 5430 may be disposed in the hollow portion 5440 to be stacked in a thickness direction D2 of the reflective member 5400. When the sub-reflective member 5430 is further disposed in the hollow portion 5440, thermal reflection efficiency of a region, in which the sub-reflective member 5430 is disposed, may be further increased. The sub-reflective member 5430 may be formed of the same material as the reflective member 5400. However, in some embodiments, the sub-reflective member 5430 may be formed of a material different from a material of the reflective member 5400. In addition, a shape of the sub-reflective member 5430 may be adjusted to adjust a temperature distribution of a wafer, similarly to the descriptions of the embodiments of FIGS. 7A to 7C.

Figure 10:
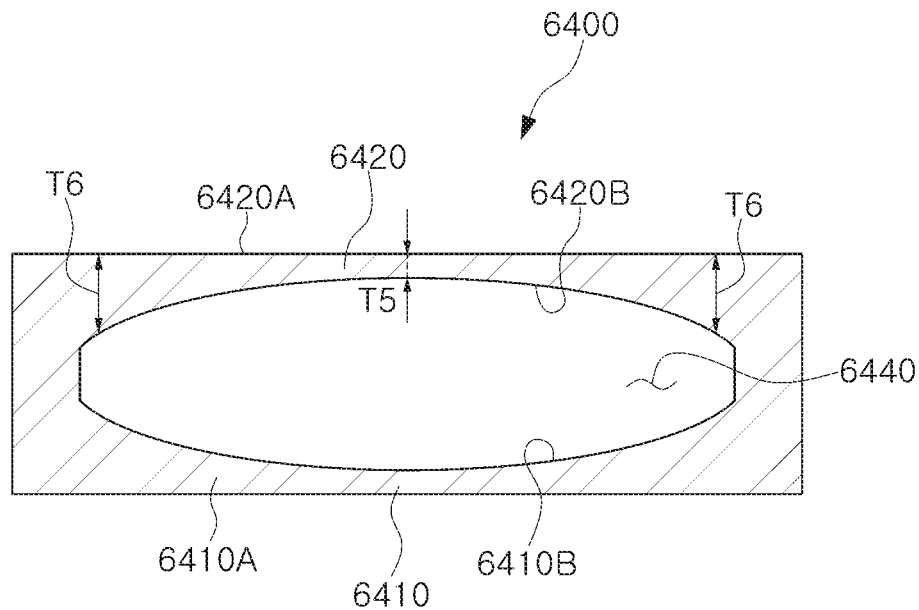

Referring to FIG. 10, an example embodiment is an example in which a shape of an internal surface of a hollow portion 6440 of a reflective member 6400 is modified. While a first internal surface and a second internal surface, defining a hollow portion, are flat in the embodiments described above, a first internal surface 6410B and a second internal surface 6420B are respectively surfaces concave in directions of a first external surface 6410A and a second external surface 6420A in this embodiment. Accordingly, a central region of each of a first plate 6410 and a second plate 6420 has a thickness T5 smaller than a thickness T6 of a circumferential region thereof, such that thermal reflectance in a central region of the reflective member 6400 may be adjusted to be higher than thermal reflectance in a circumferential region of the reflective member 6400. While the first internal surface 64140B and the second internal surface 6420B of the reflective member 6400 are formed to have a concave surface in this embodiment, they may be formed to have a convex surface in some embodiments. Alternatively, only one of the first internal surface 6410B and the second internal surface 6420B may be formed to have a concave or convex surface, or the first internal surface 6410B and the second internal surface 6420B may be formed to have different shapes. As a result, a temperature distribution of a wafer may be adjusted, similarly to the description of the embodiments of FIGS. 7A to 7C.

Figure 11:
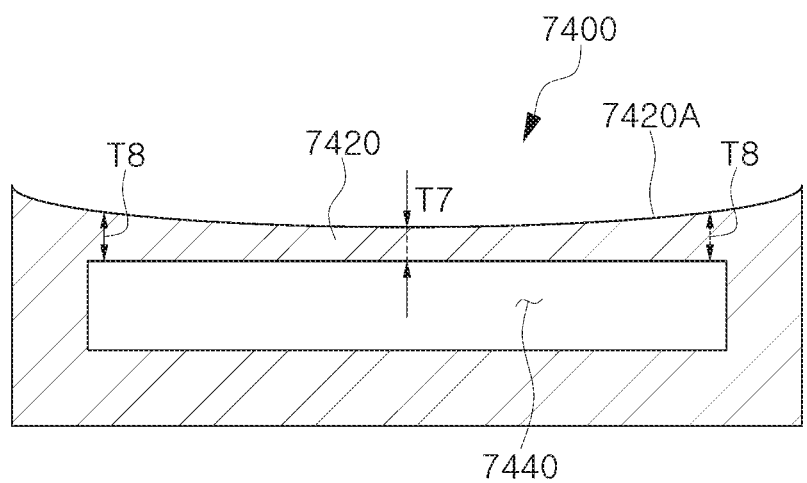

Referring to FIG. 11, an example embodiment is an example in which a shape of an external surface of a reflective member 7400 is modified. In this embodiment, a second external surface 7420A is formed as a concave surface such that a thickness T8 in a circumferential region of a second plate 7420 is greater than a thickness T7 in a central region of the second plate 7420. Therefore, the thickness T7 in the central region of the second plate 7420 is smaller than the thickness T8 in the circumferential region, such that thermal reflectance in the central region may be adjusted to be higher than thermal reflectance in the peripheral region. As a result, a surface shape of an external surface of the reflective member 7400 may be modified without changing a shape of the hollow portion 7440 to have an effect similar to a case in which the shape of the hollow portion 7440 is modified.

FIGS. 12 to 17 illustrate a substrate processing apparatus according to an example embodiment.

Figure 12:
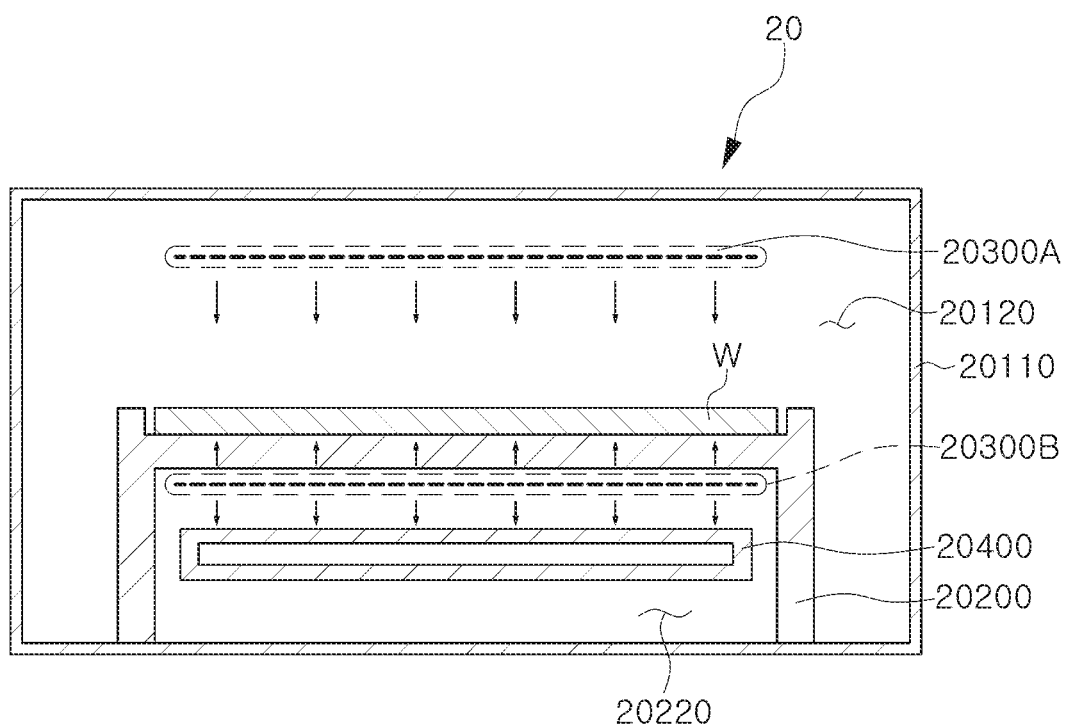
FIGS. 12 to 17 illustrate a substrate processing apparatus according to an example embodiment.

Referring to FIG. 12, an example embodiment is a case in which disposition of a heating part and a reflective member of a substrate processing apparatus 20 is modified. In this example embodiment, the reflective member 20400 is disposed in an internal space 20120, defined by an external wall 20110, and has the same shape, as compared with the above-described embodiment. Unlike the above-described example embodiment, the reflective member 20400 of a substrate processing apparatus 20 is disposed in a lower space 20220 of a support part 20200. In addition, unlike the above-described embodiment, a heating part includes a first heating part 20300A and a second heating part 20300B, and the first heating part 20300A is disposed above a wafer W and the second heating part 20300B is disposed between the reflective member 20400 and the wafer W. In some embodiments, only one of the first heating part 20300A and a second heating part 20300B may be disposed.

Figure 13:
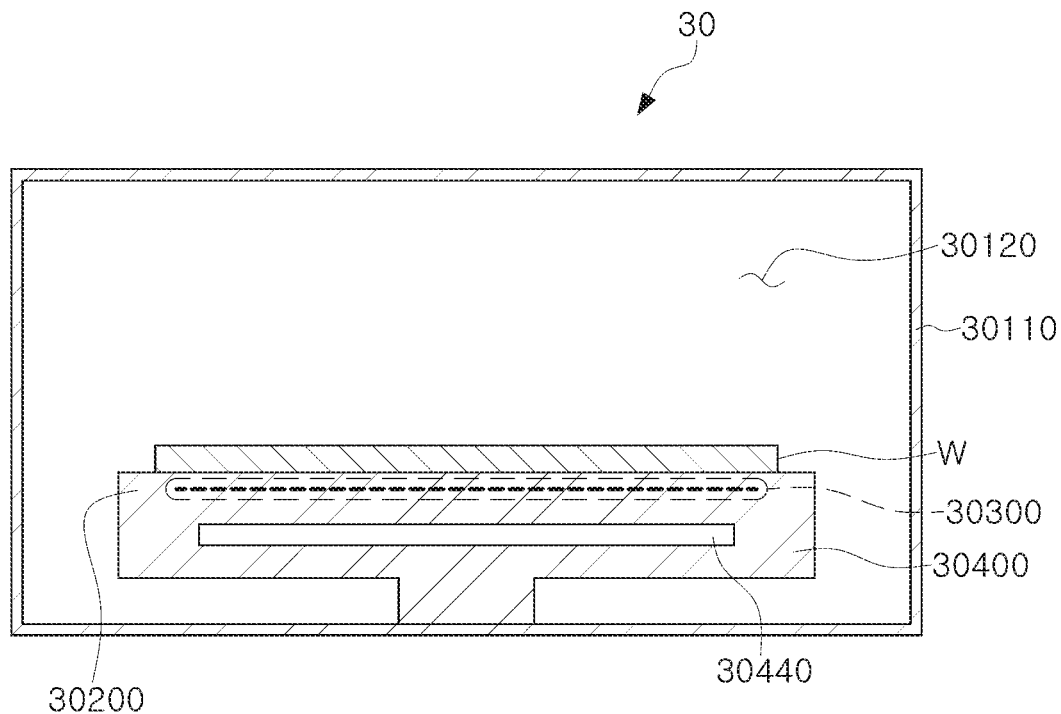

Referring to FIG. 13, an example embodiment is a case in which a support part 30200 of a substrate processing apparatus 30 and a reflective member 30400 are integrally formed in an internal space 30120, defined by an external wall 30110. In addition, a heating part 30300 is embedded in the support part 30200. The reflective member 30400 is disposed below a wafer W and a heating part 30300 is disposed in a lower portion of a substrate loading region, on which the wafer W is seated, and a hollow portion 30440 is disposed at a lower portion of the heating part 30300, which is similar to the configuration of the above-described substrate processing apparatus 20 according to an example embodiment.

Figure 14:
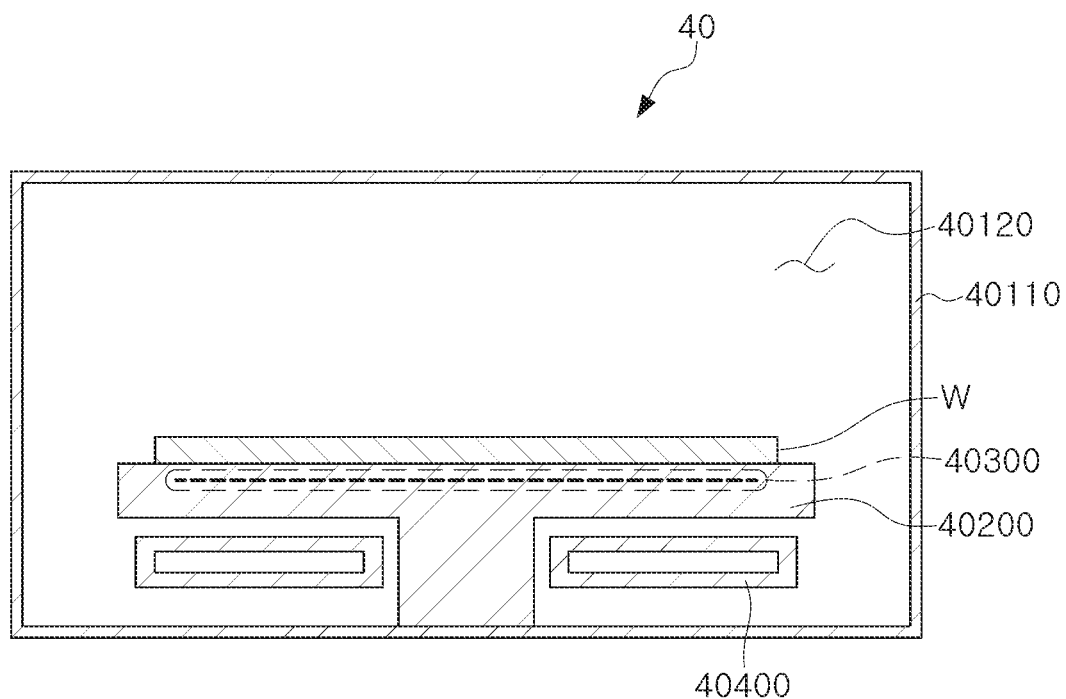

Referring to FIG. 14, an example embodiment is a case in which a support part 40200 and a heating part 40300 of a substrate processing apparatus 30 are integrally formed, and a reflective member 40400 is separated therefrom. The reflective portion 40400 is disposed in an internal space 40120 defined by an external wall 40110, which is similar to the above-described embodiment. In this embodiment, the reflective member 40400 is disposed below a wafer W, which is similar to the configuration of the above-described substrate processing apparatus 300 according to an example embodiment. However, the reflective member 40400 is separated from the support part 40200, which is different from the configuration of the above-described substrate processing apparatus 300 according to an example embodiment.

Figure 15:
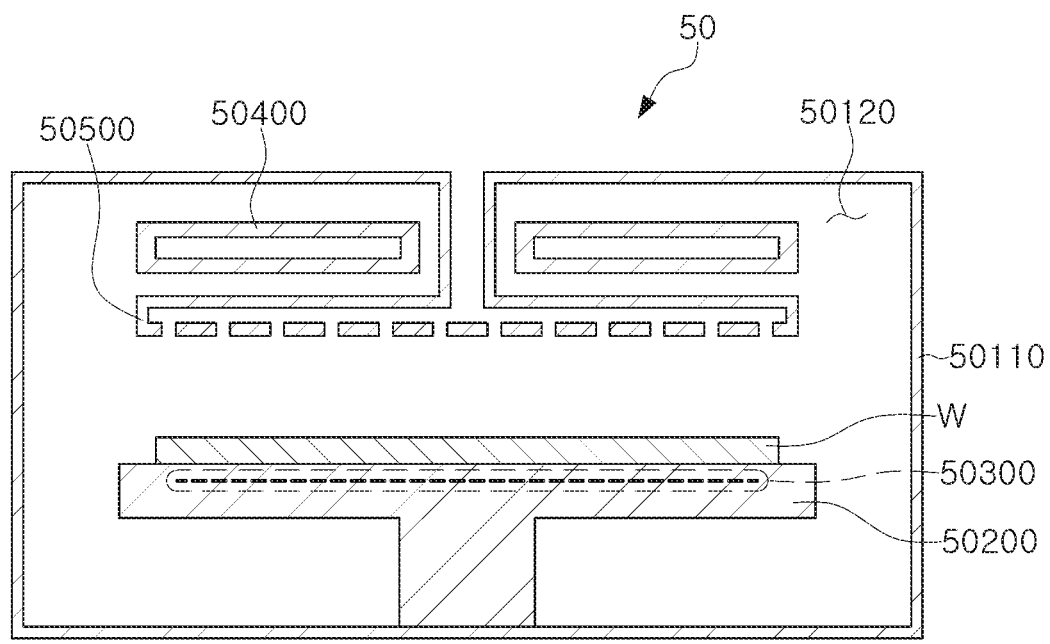

Referring to FIG. 15, an example embodiment is a case in which a reflective member 50400 of a substrate processing apparatus 50 is disposed above a showerhead 50500. The showerhead 50500 is configured to uniformly inject a process gas to a surface of a wafer W at an upper portion of the wafer W. The reflective member 50400 is disposed in an internal space 50120 defined by the outer wall 50110, which is similar to the above-described embodiment. In this embodiment, the reflective member 50400 may be disposed at an upper portion of the showerhead 50500 to reflect heat in a direction, in which the wafer W is disposed, without impeding the flow of a process gas injected to the wafer W.

Figure 16:
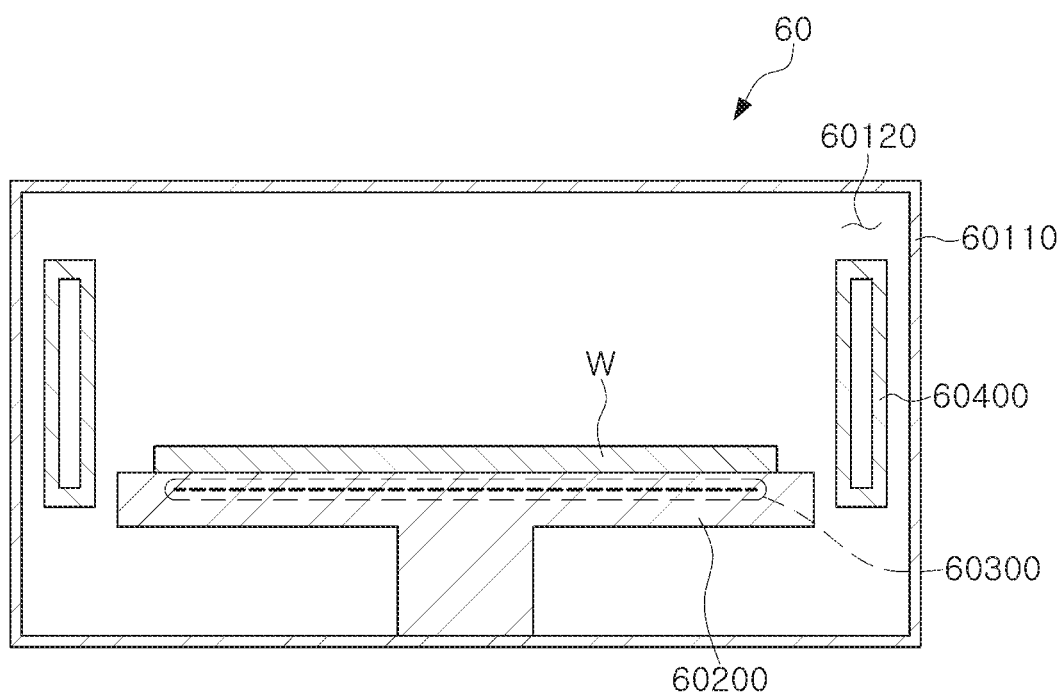

Referring to FIG. 16, in an example embodiment, a supporting part 60200 and a heating part 60300 of a substrate processing apparatus 60 are integrally formed and a reflecting portion 60400 is separated from therefrom, which is similar to the configuration of the above-described substrate processing apparatus 40 according to an example embodiment. However, the reflective member 60400 is disposed on a side surface of the support part 60200, which is different from the configuration of the above-described substrate processing apparatus 40 according to an example embodiment. In addition, the reflective member 60400 is disposed in an internal space 60120 defined by an external wall 60110, which is similar to the configuration of the above-described substrate processing apparatus 40 according to an example embodiment. The reflective member 60400 may be disposed around the support part 60200 in the form of a ring. Therefore, even when it is difficult to arrange the reflective member 60400 above the wafer W, heat may be effectively reflected. And even when heat, emitted in a direction of a side surface of the wafer W, is larger than heat emitted upwardly, heat may be effectively reflected.

Figure 17:
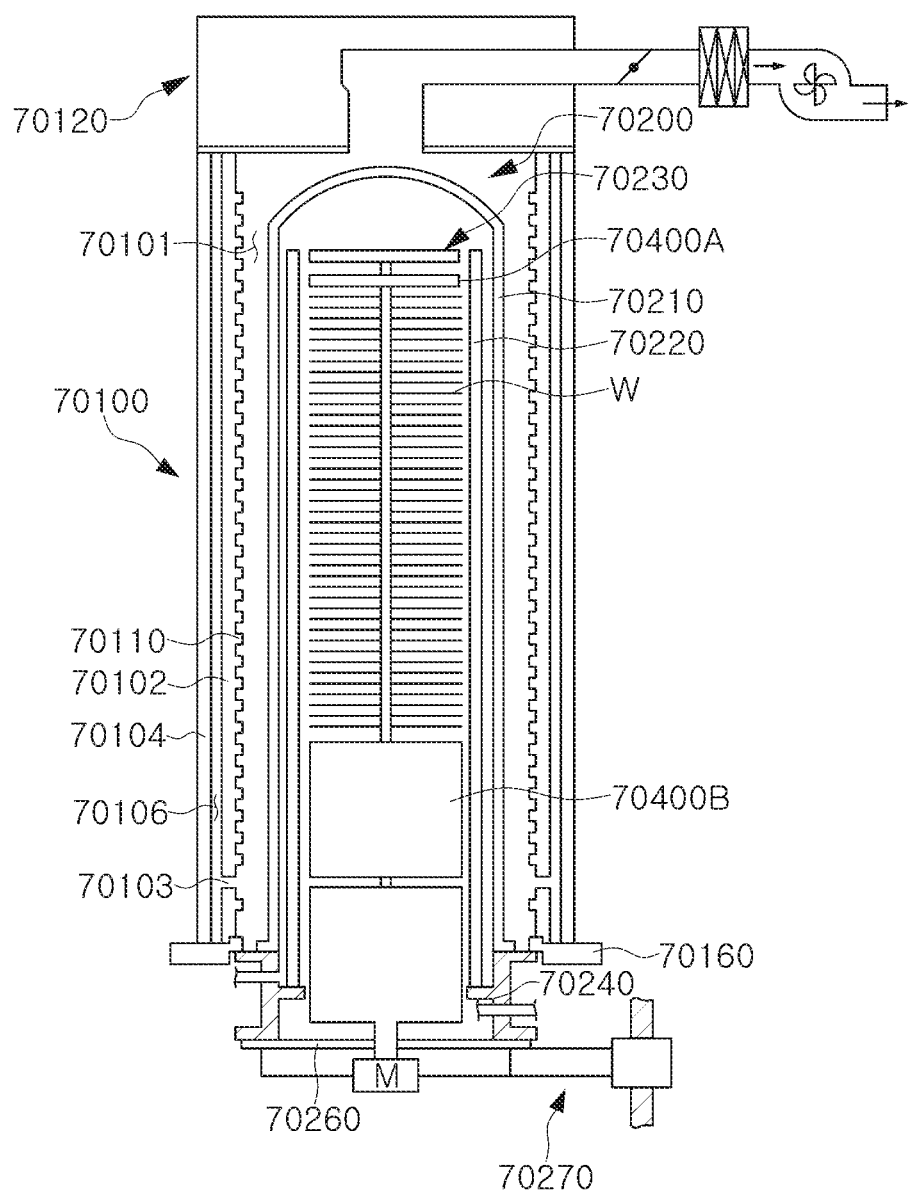

Referring to FIG. 17, a substrate processing apparatus 70 according to an example embodiment is a batch-type substrate processing apparatus to which the above-described reflective member according to an example embodiment is applied.

The substrate processing apparatus 70 may include a reaction tube 70200, extending in a vertical direction and accommodating a substrate, and a heating device disposed to surround the reaction tube 70200 and configured to heating the reaction tube 70200. The heating device may include a sidewall heat insulating material 70100, mounted outside of the reaction tube 70200, having a cylindrical shape, and a heating part 70110 such as a heater disposed inside of the sidewall heat insulating material 70100. The heating device may further include an upper wall heat insulating material 70120 covering an upper portion of the sidewall heat insulating material 70100.

The heating device may include a vertical-type furnace. The reaction tube 70200, having a concentric shape with the sidewall heat insulating material 70100, may be disposed in an internal space 70101 of the sidewall heat insulating material 70100. The reaction tube 70200 may extend in the vertical direction to define a process chamber. The reaction tube 70200 may receive a boat 70230 on which a plurality of wafers W are loaded. The boat 70230 is a support disposed to provide a substrate loading region in which a plurality of wafers W are loaded.

The sidewall heat insulating material 70100 may be supported by a heater base 70160 to be vertically mounted. A reaction tube 70200 may be disposed inside the sidewall heat insulating material 70100 having a cylindrical shape. The sidewall heat insulating material 70100 may has a multilayer structure. The sidewall heat insulating material 70100 may include sidewall internal layer 70102 and sidewall external layer 70104. A cylindrical space 70106 may be formed between the sidewall internal layer 70102 and the sidewall external layer 70104 as a cooling gas passage. A heating part 70110 such as a heater may be mounted on an internal side of the sidewall heat insulating material 70100.

A cooling gas supply port may be formed on the upper portion of the sidewall external layer 70104, and a plurality of supply holes 70103 may be formed in the sidewall internal layer. The supply holes 70103 may be formed at predetermined locations from an underlying portion to an overlying portion of the sidewall internal layer 70102 to widely disperse a cooling gas to the entire internal space 70101. The reaction tube 70200 may include an external tube 70210 and an internal tube 70220 mounted in the external tube 70210. The process chamber may be formed in the internal tube 70220 and may accommodate a plurality of wafers W stacked on multiple stages by the boat 70230 in a vertical direction and aligned in a horizontal direction. The external tube 70210 may have a shape of a cylinder having a closed upper end and an open lower end, and the internal tube 70220 may have a shape of a cylinder having open upper and lower ends. The external tube 70210 may be disposed concentrically with the internal tube 8220. When a plurality of wafers W are mounted on the boat 70230, the boat 70230 may be elevated by an elevation device 70270 to be loaded in the process chamber. In this state, a door plate 70260 may seal a lower end of a manifold 70240 through a sealing member such as an O-ring.

In an example embodiment, a reflective member 70400A, having a structure similar to the structure of the above-described reflective member 400 of FIG. 1, may be disposed on an uppermost portion of a boat 70230 on which a plurality of wafers W are mounted. Additionally, in an example embodiment, a reflective member 704400B, having a structure similar to the structure of the above-described reflective member 4400 of FIG. FIG. 8B or the above-described reactive part 5400 of FIG. 9B, may be formed on a lowermost portion of the boat 70230 on which a plurality of wafers W are mounted. Additionally, a reflective member 3400 of FIG. 7B or a reflective member 3400' of FIG. 7C may be disposed such that thermal reflectance of a central region of each of a plurality of wafers W is higher than thermal reflectance of a circumferential region thereof to uniformly adjust a temperature distribution of the plurality of wafers W.

Figure 18A:
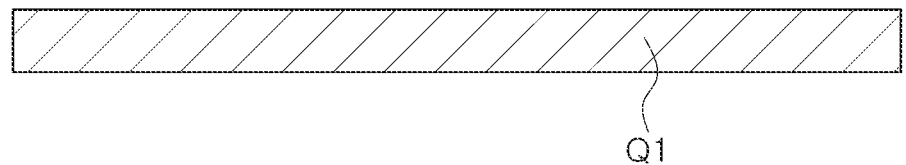
FIG. 18A to FIG. 18C illustrate a method of manufacturing a reflective member according to an example embodiment.
Figure 18B:
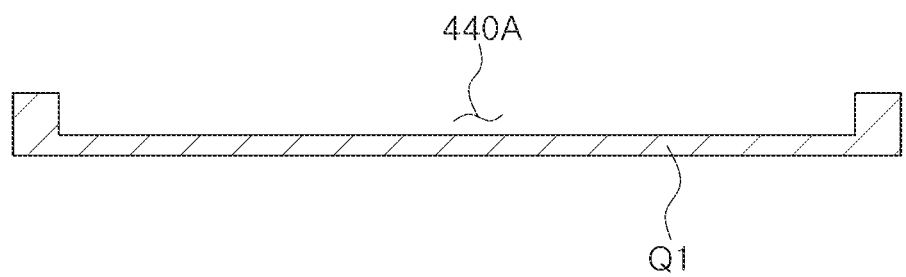
Figure 18C:
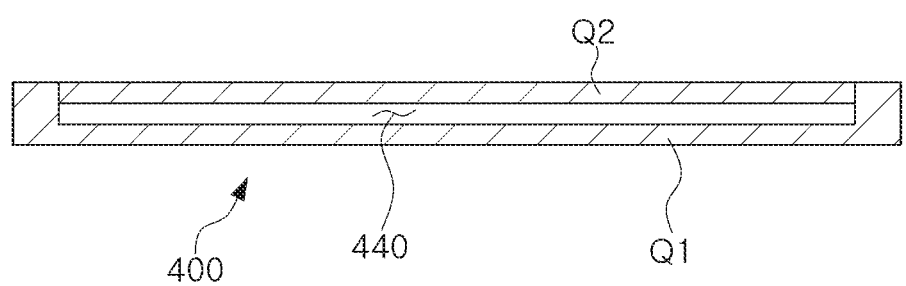

Hereinafter, a method of manufacturing a reflective member according to an example embodiment will be described with reference to FIGS. 18A to 18C. FIG. 18A to FIG. 18C illustrate a method of manufacturing the reflective member 400 of FIG. 1. The manufacturing process of the reflector according to an example embodiment will be described with reference to FIGS. 18A to 18B. FIGS. 18A to 18C are views for explaining a manufacturing process of the reflective member 400 of FIG. 1. In an example embodiment, the first plate and the side wall of the reflector are integrally formed. In an example embodiment, a case, in which a first plate and a sidewall portion of a reactive part are integrated, will be described as an example.

Referring to FIG. 18A, a base material substrate Q1 is prepared. The base material substrate Q1 may be formed of quartz. In detail, the base material substrate Q1 may be formed of various types of transparent, white and black quartz such as CFQ, OM100, OP3, Heraus Reflective Coating (HRC) and Heraus Black Quartz (HBQ).

Referring to FIG. 18B, a groove portion 440A may be formed on a top surface of the base material substrate Q1. The groove portion 440A may be formed by various physical or chemical etching methods. The groove portion 440A is a space in which a hollow portion is formed when a cover Q2 is assembled in a subsequent process. In some embodiments, a material layer may be formed on a bottom surface of the groove portion 440A by coating a low reflective material, having high absorbance, or a highly reflective material such as a metal, ceramic, and quartz.

Referring to FIG. 18C, a hollow portion 440 may be formed by bonding the cover Q2 to the base material substrate Q1. The cover Q2 may be formed of the same material as the base material substrate Q1. For example, the cover Q2 may be formed of quartz. The cover Q2 may be bonded to the base material substrate Q1 by welding using a material such as $SiO_2$. After the cover Q2 is bonded to the base material substrate Q1, a through-hole, communicating with a hollow portion 440, is formed in at least one region of the cover Q2 and the base substrate Q1 and air is exhausted from the hollow portion 440 through the through-hole, and thus, the hollow portion 440 may be maintained in a vacuum state. In some embodiments, the hollow portion 440 may have a pressure of about 10 Pa. The hollow portion 440 may be filled with air or a desired (or, alternatively, a predetermined) gas.

As described above, a substrate processing apparatus according to an example embodiment may increase a heat insulating effect to prevent energy loss from occurring during substrate processing and may alleviate a heat distribution difference of a substrate to secure temperature uniformity.

While example embodiments have been shown and described above, it will be apparent to those skilled in the art that modifications and variations could be made without departing from the scope of the present inventive concept as defined by the appended claims.

What is claimed is:

1. A substrate processing apparatus comprising:
   a process chamber;
   a support part in the process chamber, the support part including a substrate loading region configured to support a substrate seated therein;
   a heating part configured to heat the substrate loading region; and
   a reflective member adjacent to the substrate loading region in the process chamber, the reflective member including a first plate and a second plate separated from each other in a vertical direction of the reflective member and a pair of side walls extending perpendicular to the first plate and the second plate with a sealed hollow portion therein that is sealed on all sides and extends parallel to an upper surface of the substrate loading region such that a distance the sealed hollow portion extends within the reflective member is greater in a horizontal direction than a distance the sealed hollow portion extends in the vertical direction, the second plate being closer to the support part than the first plate, and the sealed hollow portion being configured to reflect the heat absorbed by the reflective member back towards the second plate,
   wherein the reflective member includes internal surfaces including a first internal surface, a second internal surface and an internal side surface defining the sealed hollow portion, the first internal surface facing the substrate loading region, the second internal surface opposing the first internal surface with the internal side surface connecting the first internal surface and the second internal surface,
   wherein the reflective member includes a reflective material having a first reflectance, and
   at least one of the first internal surface and the second internal surface includes a material having a second reflectance coated thereon with a distance between the first internal surface and the second internal surface that oppose each other in the vertical direction being between 1 mm and 10 mm, the second reflectance being higher than the first reflectance and the sealed hollow portion being vacuum sealed.

2. The substrate processing apparatus of claim 1, wherein the reflective member includes external surfaces,
the external surfaces including a first external surface, a second external surface, and an external side surface, the second external surface opposing the first external surface with the external side surface connecting the first external surface and the second external surface.

3. The substrate processing apparatus of claim 2, wherein the first external surface, the second external surface and the external side surface each include a material having a fourth reflectance coated thereon, the fourth reflectance being higher than the first reflectance.

4. The substrate processing apparatus of claim 2, wherein the second external surface has a flat reflective surface.

5. The substrate processing apparatus of claim 2, wherein at least one of the first internal surface and the second internal surface has a flat surface.

6. The substrate processing apparatus of claim 2, wherein at least one of the first external surface and the second external surface has a convex surface or a concave surface, the convex surface or the concave surface facing the substrate loading region.

7. The substrate processing apparatus of claim 1, wherein
a first one of the first internal surface and the second internal surface includes a material having a second reflectance coated therein, the second reflectance being higher than the first reflectance, and
a second one of the first internal surface and the second internal surface includes a material having a third reflectance coated thereon, the third reflectance being lower than the first reflectance.

8. The substrate processing apparatus of claim 1, wherein the sealed hollow portion corresponds to a central region or a circumferential region of the substrate.

9. The substrate processing apparatus of claim 1, wherein the reflective member includes a plurality of separated regions each having the sealed hollow portion therein, the plurality of separated regions being stacked in a thickness direction of the reflective member.

10. The substrate processing apparatus of claim 9, wherein at least one sub-reflective member is in the sealed hollow portion.

11. The substrate processing apparatus of claim 10, wherein the sub-reflective member includes a plurality of sub-reflective members stacked in the thickness direction of the reflective member.

12. A substrate processing apparatus comprising:
a process chamber;
a support part in the process chamber, the support part including a substrate loading region configured to support a substrate seated therein;
a heating part configured to heat the substrate loading region; and
a reflective member adjacent to the substrate loading region in the process chamber, the reflective member including a first plate and a second plate separated from each other in a vertical direction of the reflective member and a pair of side walls extending perpendicular to the first plate and the second plate with a sealed hollow portion therein that is sealed on all sides and extends parallel to an upper surface of the substrate loading region such that a distance the sealed hollow portion extends within the reflective member is greater in a horizontal direction than a distance the sealed hollow portion extends in the vertical direction, the second plate being closer to the support part than the first plate, the reflective member configured to reflect heat emitted from the substrate loading region to the substrate loading region and the sealed hollow portion being configured to reflect a portion of heat emitted from the substrate loading region that is absorbed by the reflective member back towards the second plate, the reflective member including at least one of quartz, ceramic, and a metal,
wherein the reflective member is disc shaped and has a diameter of 280 mm to 320 mm and a thickness of 10 mm to 20 mm, and the sealed hollow portion therein has a thickness of 3 mm to 5 mm,
wherein the reflective member includes internal surfaces including a first internal surface, a second internal surface and an internal side surface defining the sealed hollow portion, the first internal surface facing the substrate loading region, the second internal surface opposing the first internal surface with the internal side surface connecting the first internal surface and the second internal surface,
wherein the reflective member includes a reflective material having a first reflectance, and
at least one of the first internal surface and the second internal surface includes a material having a second reflectance coated thereon with a distance between the first internal surface and the second internal surface that oppose each other in the vertical direction being between 1 mm and 10 mm, the second reflectance being higher than the first reflectance and the sealed hollow portion being vacuum sealed.

13. The substrate processing apparatus of claim 12, wherein the heating part is within the support part.

14. The substrate processing apparatus of claim 13, wherein the sealed hollow portion corresponds to a central region of the substrate.

15. The substrate processing apparatus of claim 12, wherein the reflective member is above the substrate loading region, and the heating part is below the substrate loading region.

16. The substrate processing apparatus of claim 12, wherein the reflective member is below the substrate loading region, and the heating part is at least one of above the substrate loading region or below the substrate loading region.

17. The substrate processing apparatus of claim 12, wherein
the reflective member is at least one of above the substrate loading region or below the substrate loading region, and
the heating part is within the support part.

18. The substrate processing apparatus of claim 12, wherein the reflective member comprises:
a base having a concave groove portion; and
a cover bonded to the base, the cover covering the concave groove portion to form the sealed hollow portion.

19. A substrate processing apparatus comprising:
a process chamber; and
a support part in the process chamber, the support part including,
a substrate loading region configured to support a substrate seated therein, a first heating part below the substrate loading region and a second heating part above the substrate loading region, and a sealed hollow portion within the support part below the first heating part, the sealed hollow portion defined by internal surfaces including first and second internal surfaces separated from each other in a vertical direction of the first heating part and a pair of internal side surfaces connecting the first internal surface and the second internal surface and extending perpendicular thereto, the sealed hollow portion being sealed on all sides thereof and extending parallel to an upper surface of the substrate loading region such that a distance the sealed hollow portion extends within a reflective member is greater in a horizontal direction than a distance the sealed hollow portion extends in the vertical direction, the sealed hollow portion configured to reflect heat emitted by the first heating part away from the substrate loading region back towards the substrate loading region, wherein the reflective member includes internal surfaces including a first internal surface, a second internal surface and an internal side surface defining the sealed hollow portion, the first internal surface facing the substrate loading region, the second internal surface opposing the first internal surface with the internal side surface connecting the first internal surface and the second internal surface, wherein the reflective member includes a reflective material having a first reflectance, and wherein at least one of the first internal surface and the second internal surface includes a material having a second reflectance coated thereon with a distance between the first internal surface and the second internal surface that oppose each other in the vertical direction being between 1 mm and 10 mm, the second reflectance being higher than the first reflectance and the sealed hollow portion being vacuum sealed.

* * * * *